United States Patent [19]

Greuter et al.

[11] Patent Number: 5,071,828
[45] Date of Patent: Dec. 10, 1991

[54] PROCESS FOR THE PRODUCTION OF A CRYSTAL-ORIENTED SURFACE LAYER OF A CERAMIC HIGH TEMPERATURE SUPERCONDUCTOR

[75] Inventors: Felix Greuter, Baden; Claus Schüler, Widen, both of Switzerland

[73] Assignee: Asea Brown Boveri Ltd., Baden, Switzerland

[21] Appl. No.: 490,290

[22] Filed: Mar. 8, 1990

[30] Foreign Application Priority Data

Mar. 15, 1989 [CH] Switzerland ................ 946/89

[51] Int. Cl.$^5$ ............................................. B05D 3/02
[52] U.S. Cl. ............................. 505/1; 505/733; 427/62; 427/190; 427/189
[58] Field of Search ............. 505/1, 733; 427/62, 427/63, 190, 189

[56] References Cited

FOREIGN PATENT DOCUMENTS 292340 11/1988 European Pat. Off.
300646 1/1989 European Pat. Off.
301655 2/1989 European Pat. Off.

OTHER PUBLICATIONS

Shgimizu et al., "Tape Conductor Fabrication Processes for High-Tc $Ba_2YCu_3O_{7-y}$", Jpn. J. Appl. Phys. 27(3), Mar. 1988, L414–416.
Tachikawa et al., "Fabrication of Superconducting Y-Ba-Cu Oxide Through an Improved Diffusion Process", Jpn. J. Appl. Phys. 27(8), Aug. 1988, L501–503.
Severin et al., "Superconducting $YBa_2 Cu_3O_x$ Thin Layers by Solid State Diffusion", Mat. Res. Rull., vol. 23 (1988), pp. 707–717.
Gurvitch et al., "Preparation and Substrate Reactions of Superconducting Y-Ba-Cu-O Films", Appl. Phys. Lett. 51(13), Sep. 1987, pp. 1027–1029.
Singh et al., "Mechanical and Superconducting Properties of Sintered Composite $YB_2 Cu_3O_{7-\delta}$ Tape on a Silver Substrate", Appl. Phys. Lett. 53(3), Jul. 1988, pp. 237–239.
Oda et al., "Superconductivity of $Y_lBa_2(Cu_{l-x}Fe_x)_3O_y$", Jpn. J. Appl. Phys. 26(10), Oct. 1987, L660–L663.
Escudero et al., "Superconductivity at 90K in the Y-Ba-Al-Cu-O System", Jpn. J. Appl. Phys. 26(6), Jun. 1987, L1019–L1020.
Japanese Journal of Applied Physics, vol. 27, No. 7, Jul. 1988, K. Koshino et al.: "Preparation of Superconducting Bl-Sr-Ca-Cu-O Printed Thick Films on MgO Substrate an Ag Metal Tape", pp. L1297–L1299.
F. Kloucek, W. E. Rhine, H. K. Bowen, "Thick Films of $YBa_2Cu_3O_x$ Fabricated from Colloidal Solutions", International Conference on High-$T_c$ Superconductors, Interlaken 1988, pp. 798, 799.
P. Murugaraj et al., "Preparation of Highly Oriented Polycrystalline $YBa_{2-y}Cu_3O_x$ Superconductors", Solid State Communications, vol. 66, No. 7, 1988, pp. 735–738.
T. Takenaka et al., "Superconducting Properties of Grain-Orientated $YBa_2Cu_3O_{7-x}$ Ceramics", Japanese Journal of Applied Physics, vol. 27, No. 7, 1988, L1209–L1212.
Junji Tabuchi et al., "Preparation of Superconducting Y-Ba-Cu-O Thick Films with Preferred C-Axis Orientation by a Screen-Printing Method": Appl. Phys. Lett. 53(7), Aug. 15, 1988.
J. T. Markert et al., "Magnetism, Superconductivity, and Chemical Substitutions in $YBa_2Cu_3O_{7-\delta}$", MRS Bulletin/Jan. 1989.

Primary Examiner—Shrive Beck
Assistant Examiner—Roy V. King
Attorney, Agent, or Firm—Oblon, Spivak, McClelland, Maier & Neustadt

[57] ABSTRACT

Process for the production of a polycrystalline, crystal-oriented layer of a high temperature superconductor of the class (Y,RE) $Ba_2Cu_3O_{\approx 7}$ on a substrate or between two substrates of Ag or an Ag alloy containing up to 20% by weight Au, Pd or Pt, wherein a first powder layer, of at most 5 $\mu$m thickness and consisting of the simple oxides and/or mixed oxides of the elements Y, Ba, Cu in the ratio Y:Ba:Cu:O = 1:2:3:6.5, is first applied, and on it is applied a second powder layer of the superconducting substance (Y,RE) $Ba_2Cu_3O_{\approx 7}$ in a thickness of 5–10 $\mu$m, and the whole is sintered in an $O_2$-containing atmosphere.

13 Claims, 2 Drawing Sheets

PROCESS FOR THE PRODUCTION OF A CRYSTAL-ORIENTED SURFACE LAYER OF A CERAMIC HIGH TEMPERATURE SUPERCONDUCTOR

BACKGROUND OF THE INVENTION

1. Field of the Invention

Technology of electrical superconductors. The importance of materials which have superconducting properties has greatly increased very recently. The discovery of new superconducting materials, in particular of the rare earth/Ba/Cu/O type, led to a considerable expansion of the possible applications of superconductors, since these materials already become superconducting at temperatures above 50 K.

The invention relates to the further development and improvement of products made from a ceramic high temperature superconductor, wherein the needs of large-scale industrial production are to be taken into account.

In particular, the invention relates to a process for the production of a polycrystalline, crystal-oriented surface layer on a substrate or an interlayer between two substrates, where said layer consists of a ceramic high temperature superconductor based on $(Y,RE) Ba_2Cu_3O_{6.5+y}$, where RE=rare earth metal and $0<y<1$.

2. Discussion of Background

Among the oxide high temperature superconductors, the compounds containing yttrium, barium and copper appear to be particularly promising. In contrast to the classical metallic or intermetallic superconductors, however, their brittleness, the difficulty of processing them, and above all their deficient current conductivity (low critical current density $j_c$) are obstacles to their use. The oxide compound $YBa_2Cu_3O_{6.5+y}$ ($0<y<1$) is a superconductor with a critical temperature $T_c=93$ K, when it is present in the orthorhombic modification and y is about 0.4–0.5. If a monocrystalline thin layer (d=50−500 nm) is produced by vapor deposition or cathode sputtering, maximum critical current densities $j_c \approx 5 \times 10^6$ A/cm$^2$ (at 77 K and magnetic field H=0) parallel to the plane of the layer are found when the layer is oriented with its orthorhombic c-axis perpendicular to the plane of the layer. This orientation is obtained when a single crystal of $SrTiO_3$ is used as the substrate with its surface oriented such that the <100> direction of its cubic structure is perpendicular to the surface. Apart from this, the substrate temperature and atmosphere in the coating apparatus must be suitably chosen. On the other hand, critical current densities of at most only $j_c \approx 1000$ A/cm$^2$ (T=77 K, H=0) were obtained for polycrystalline, massive ceramics, even under optimum conditions of production. The weak coupling of the superconductor currents over grain boundaries has long been known as a cause of this severe reduction of $j_c$ in polycrystalline ceramics, which severely restricts technical applications. It is further known that in this respect the grain boundaries perpendicular to the c-axis have a particularly unfavorable action, while the grain boundaries perpendicular to the a- or b-axis can carry much greater superconductor currents. Hence there has been no lack of research to produce ceramics, and in particular polycrystalline layers of the above-named material, whose crystals are aligned as completely as possible so that there are no grain boundaries in the direction of the superconducting current which severely reduce the current. All of the crystallites must then have their c-axes perpendicular to the substrate surface, while the a- and b-axes can be arbitrarily oriented. Indeed, layers have now already been produced whose crystallites were partially oriented in this manner, but up to now only disappointingly low critical current densities were obtained, at most 70 A/cm$^2$, i.e., less than 1/10 of that found in the best unoriented ceramics. This inadequate result can be partially explained by the use of unsuitable substrates which react in an undesired manner on sintering of the superconducting substance and which contaminate the grain boundaries with foreign phases.

The following literature references are cited with respect to the state of the art:

F. Kloucek, W. E. Rhine, H. K. Bowen, "Thick films of $YBa_2Cu_3O_x$ fabricated from colloidal solutions", Internat. Conf. on High-T Superconductors, Interlaken 1988

P. Murugaraj et al., "Preparation of highly oriented Polycrystalline $YBa_{2-y}Cu_3O_x$ Superconductors", Solid State Communciations, vol. 66, No. 7, 1988, pp. 735-738

Tadashi Takenaka, Hideki Noda, Atsuhiko Yoneda and Koichiro Sakata, "Superconducting Properties of Grain-Oriented $YBa_2Cu_3=7$-x Ceramics", Japanese Journal of Applied Physics, Vol. 27, No. 7, 1988, pp. L1209–L1212

Junji Tabuchi and Kazuaki Utsumi, "Preparation of superconducting Y-Ba-Cu-O thick films with preferred c-axis orientation by a screen-printing method", Appl. Phys. Lett. 53(7), 15 August 1988

J. T. Markert, B. D. Dunlap, and M. B. Maple, "Magnetism, Superconductivity, and Chemical Substitutions in $YBa_2Cu_3O_{7-\delta}$", MRS Bulletin/January 1989.

The superconducting ceramic layers produced by the known processes are insufficient by far for the present requirements. There therefore exists a great need for improvement and further development of such layers.

SUMMARY OF THE INVENTION

Accordingly, one object of this invention is to provide a novel process for the production of a crystal-oriented surface layer of a ceramic high temperature superconductor based on $(Y,RE)Ba_2Cu_3O_{6.5+y}$ where RE=rare earth metal and $0<y<1$, which process can be carried out in a simple manner and provides reproducible results, in such a manner that an optimum orientation of the c-axes of the crystallites of this polycrystalline layer of the superconducting substance is ensured under all circumstances. The superconducting surface layers produced according to the process are to have a thickness of at least 10 $\mu$m and a critical current density (current carrying capacity) of at least $10^3$ A/Cm$^2$.

This object is achieved in that pure metallic silver or a silver alloy containing up to 20% by weight of Au or Pd or Pt is used as the substrate in the process mentioned at the beginning, and in that a first powder layer of a thickness of at most 5 $\mu$m with particles of diameter $<2$ $\mu$m, consisting of the simple oxides and/or mixed oxides of the elements Y, Ba, Cu or the oxides of the elements Y and Cu and the carbonate of Ba, corresponding to the stoichiometric ratio Y:Ba:Cu:O=1:2:3:6.5, is applied to said substrate, and on it is applied a second powder layer, consisting of 1–10 mol % of the above mentioned powder mixture and the remainder powder of the superconducting substance $(Y,RE) Ba_2Cu_3O_{6.5+y}$, with a thickness of 5–50 $\mu$m, and the whole is sintered in an atmosphere of at least 20% by volume $O_2$, remainder $N_2$ or an inert gas, under a total gas pressure of at least 1 bar at a sintering temperature of at least 885° C. and at most 927° C., wherein the whole is first heated at a rate of at most 50° C./h to 400° C., then at a rate of at most 300° C./h to the sintering temperature, and held at this temperature for 30 minutes, whereupon a liquid phase of 0.1–5% by volume is transitorily formed in the layer, and in that the whole is cooled at a rate of at most 100° C./h to 600°–400° C., held at this temperature for 2 hours, and finally cooled at a rate of at most 100° C./h to room temperature.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
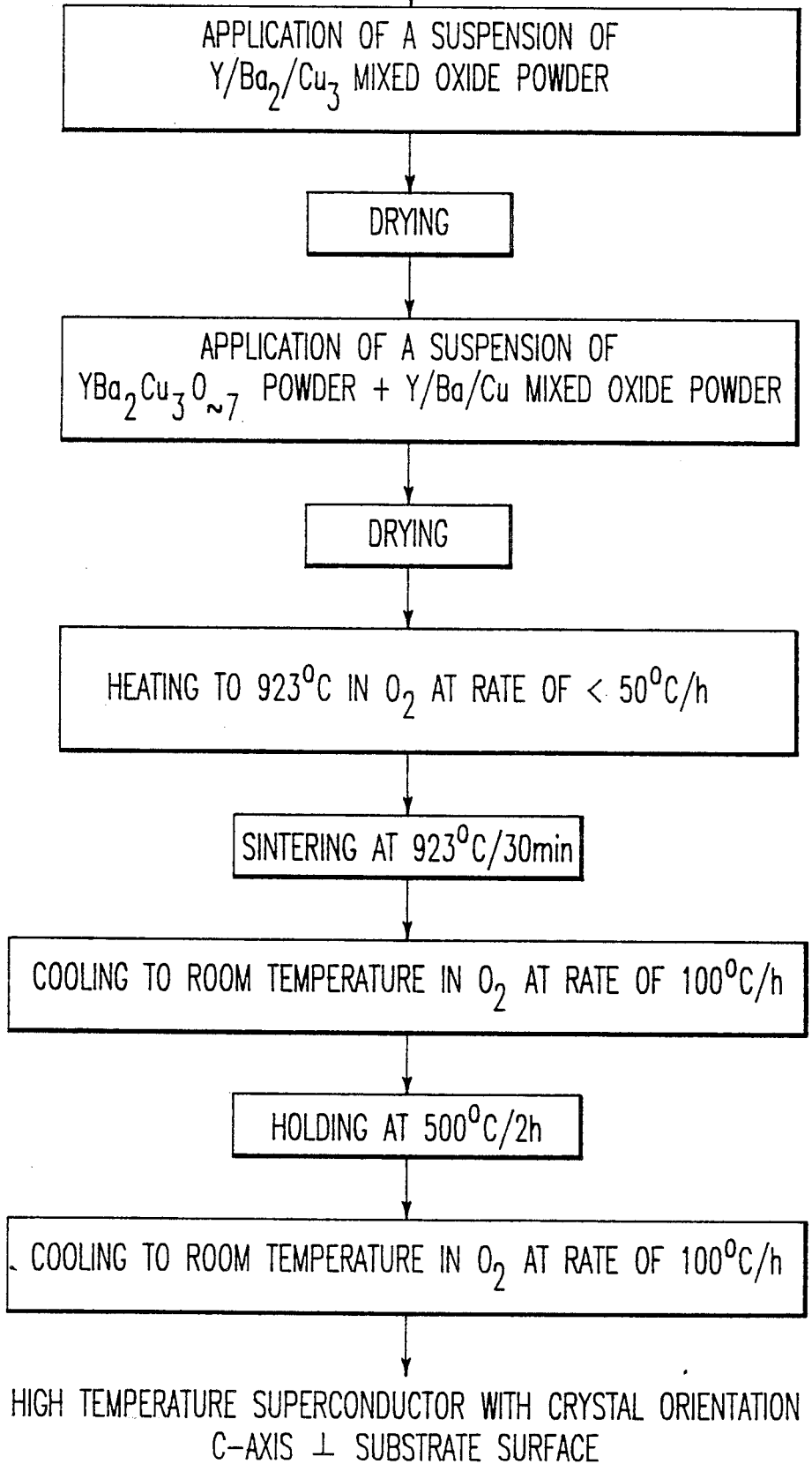
FIG. 1 shows a flow chart (block diagram) of the process for production of a crystal-oriented surface layer of a ceramic high temperature superconductor.

Referring now to the drawings, wherein like reference numerals designate identical or corresponding parts throughout the several views, in FIG. 1 a flow chart (block diagram) is shown of the process for the production of a crystal-oriented surface layer of a ceramic high temperature superconductor. The present case concerns the production of a layer of the superconducting substance $YBa_2Cu_3O_{\simeq 7}$ on an Ag substrate. The diagram needs no further explanation. The application of the first and second powder mixtures can take place by repeated soaking in the suspension and drying.

Figure 2:
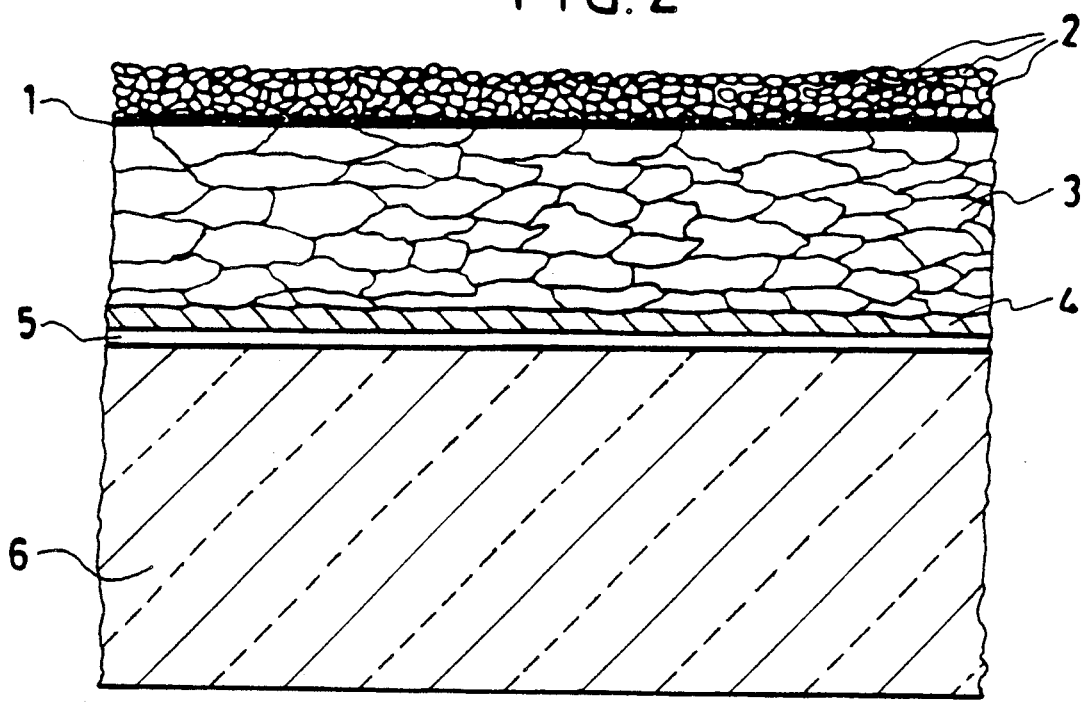
FIG. 2 shows a schematic (metallographic) section, before sintering, through powder layers applied to a substrate.

FIG. 2 relates to a schematic (metallographic) section, before sintering, through powder layers applied to a substrate. A first powder layer of oxide mixtures and mixed oxides with a stoichiometric ratio of the elements Y:Ba:Cu:O=1:2:3:6.5 is represented by 1. This first powder layer is applied directly to the substrate 3, which is in the form of an Ag sheet or band. The second powder layer 2, substantially of a superconducting substance of composition $YBa_2Cu_3O_{\simeq 7}$, which is next applied overlays this first powder layer 1. A support 6 is of a constructional material which withstands at least the sintering temperatures (max. ca. 930° C.) without being changed or deformed. In the present case, 6 means a bar or a plate of $SiO_2$. 5 is a Cr layer acting as a bonding agent. 4 is a thin layer of Pd, which passes over to the substrate proper 3.

Figure 3:
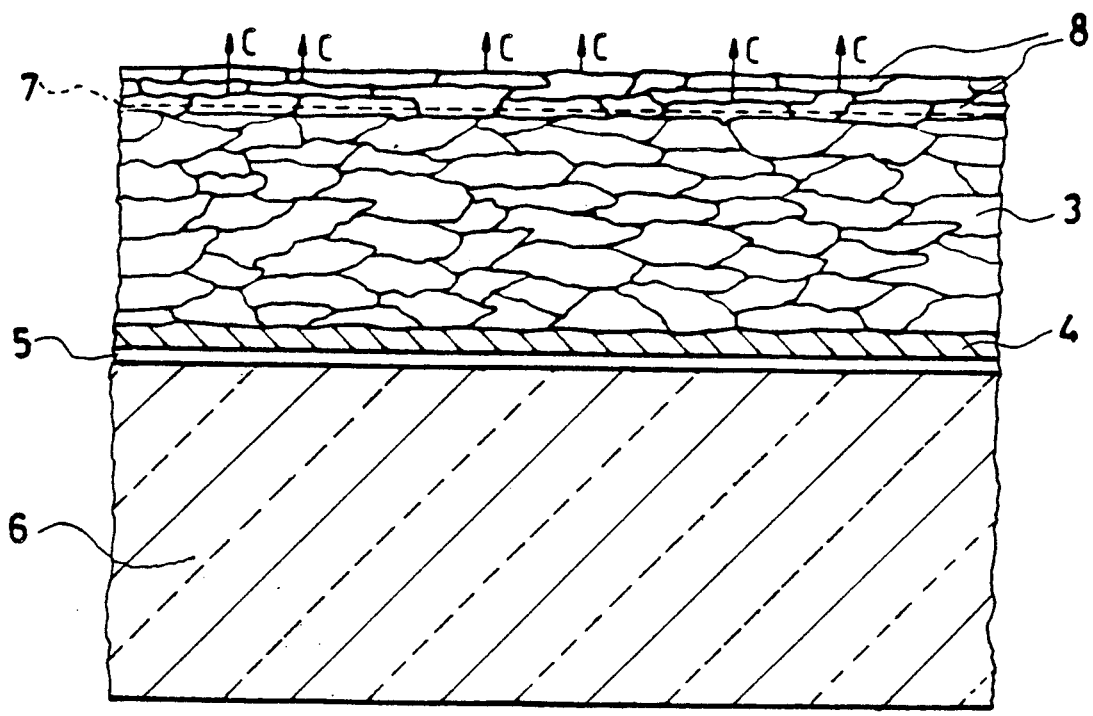
FIG. 3 shows a schematic (metallographic) section, after sintering, through a superconducting surface layer applied to a substrate.

A schematic (metallographic) section, after sintering, through a superconducting surface layer applied to a substrate is shown in FIG. 3. The reference numerals 3, 4, 5 and 6 correspond exactly to those of FIG. 2. The zone 7 of the transitory liquid phase formed transiently in the course of the heat treatment directly adjoins the boundary surface of the substrate 3. The zone 7 of the transient liquid phase which is formed in the course of the heat treatment directly adjoins the boundary surface of the substrate 3. This zone is symbolically indicated by a dashed line. Of course, it can above all extend along the grain boundaries of the superconducting substance and further into the latter. 8 is the finished polycrystalline, crystal-oriented surface layer of the superconducting substance $YBa_2Cu_3O_{\simeq 7}$, the crystallites of which are oriented such that their c-axes stand perpendicular to the substrate surface. This is indicated by the arrows c, which originate in various places.

In general:

The core of the invention essentially consists of two characterizing features:
1. Use of Ag or an Ag-rich alloy as substrate.
2. Transitory production of a "transient" liquid phase as a sintering aid, which is converted in the course of the sintering process into superconducting substance, without leaving foreign materials behind.

Liquid phases of the abovementioned kind are formed in the binary system $Y_2O_3/BaO/CuO$ when finely-divided powder of the starting materials is brought to temperatures of 915°–940° C. and caused to react together under an $O_2$ pressure of 1 bar.

For example, the reaction

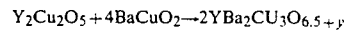
$$Y_2Cu_2O_5 + 4BaCuO_2 \rightarrow 2YBa_2Cu_3O_{6.5+y}$$

begins above 920° C. with the formation of a liquid phase, which substantially consists of the eutectic between $BaCuO_2$ and $CuO$. In the further course of this reaction, $YBa_2Cu_3O_{6.5+y}$ increasingly arises until at last the starting materials have been completely converted into this phase. The liquid phase arises at the contact points of the powder grains of $Y_2Cu_2O_5$ and accelerates the reaction of the two solid starting phases to form solid $YBa_2Cu_3O_{6.5+y}$. Apart from this, the liquid phase strongly promotes the crystallization of the reaction product. After the course of the reaction, there is obtained a polycrystalline sintered body which is dense and largely porefree, and consists completely of well crystallized, monophasic $YBa_2Cu_3O_{6.5+y}$. The transitorily arising liquid phase thus quantitatively disappears again.

Other starting materials react in an analogous manner, e.g.:

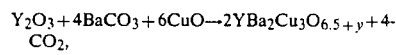
$$Y_2O_3 + 4BaCO_3 + 6CuO \rightarrow 2YBa_2Cu_3O_{6.5+y} + 4CO_2,$$

where the gaseous $CO^2$ leaves as a by-product, or

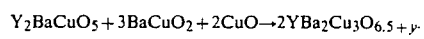
$$Y_2BaCuO_5 + 3BaCuO_2 + 2CuO \rightarrow 2YBa_2Cu_3O_{6.5+y}.$$

Here no by-product arises.

The use of reactions with no by-products is preferred, since material with pure phases is thus obtained, and the formation of pores by occluded gases is avoided. For the production of densely sintered material, it is important to limit the volume fraction of the liquid phase to 0.1–5%. Too much liquid phase leads to local segregation processes and inhomogeneous sintered bodies whose phases are not pure. It has been found to be difficult to control at will the volume fraction of the liquid phase during the course of the reaction, e.g. by precise temperature control. However, control can easily be achieved by the use of a powder mixture which predominantly consists of completely reacted $YBa_2Cu_3O_{6.5+y}$ powder, to which is added a proportion of as yet unreacted starting powders in the correct stoichiometric ratio, e.g. 90% by weight of $YBa_2Cu_3O_{6.5+y}+10\%$ by weight of $(Y_2Cu_2O_5+4BaCuO_2)$.

The preparation and processing of the powder must take place in an inert atmosphere, in particular with the exclusion of water and $CO_2$, since $YBa_2Cu_3O_{7-\delta}$, $Y_2Cu_2O_5$, $Y_2BaCuO_5$ and $BaCuO_2$ react rapidly with these materials and are decomposed, with the formation of $BaCO_3$ or $Ba(OH)_2$. The described powders are easily dispersed in inert liquids and deposited from the suspensions as layers. Suitable suspensions are obtained, for example, by treating starting powders together with isopropanol (water content <0.01% by volume) and addition of 2% by weight of hydroxypropylcellulose (molecular weight 300,000), based on the powder weight. The particle size of the powders should be less than 2 μm, preferably between 0.8 μm and 0.1 μm. This can easily be achieved by classification of the powder suspensions, e.g. with the aid of a centrifuge. A narrow distribution of particle sizes, in the region of 0.8 μm–0.1 μm, is required so that the deposited powder layers have dense packing and hence high green densities. Loose packing and low green densities (>50% of the theoretical density) lead to higher shrinkage and crack formation in the layers on sintering.

In general, a first layer of the starting powders and a second layer of powder of the superconducting substance (including a small added proportion of the first powder) are applied to the Ag substrate and respectively dried. The substrate with the powder layer on it is now sintered in a furnace through which flows oxygen at a pressure of 1 bar. The temperature is first slowly (50° C./h) raised to 400° C. in order to burn adherent suspension media off the powder particles. The temperature is then raised at 300° C./h to 923° C. and is held there for 30 minutes. The layer thereby sinters, under the action of the transitorily formed liquid phase which arises with a high volume fraction of $Y_2Cu_2O_5+4BaCuO_2$ near the silver/powder interface, but with a smaller volume fraction in the other layer, since only 10% by weight of the reactive powder mixture is present there. The crystallites of $YBa_2Cu_3O_{6.5+y}$ which rapidly form at the interface due to the reaction are now, surprisingly, oriented such that their c-axes stand perpendicular to the substrate surface. Crystal formation and sintering proceeds somewhat more slowly in the remaining volume, and is oriented on the initially formed crystals near the substrate surface. Crystallites thus preferably grow with the same orientation.

Layers produced on silver substrates in this manner are about 10 μm thick; they consist of a dense structure of crystals whose c-axes stand for the most part perpendicular to the substrate surface and whose a- and b-axes lie randomly parallel to the substrate surface. The critical temperature of the superconducting layers is 90–93 K. The orientation of the crystallites can be determined by X-ray diffraction. The primary beam is incident on the substrate surface in the azimuthal direction for this purpose. With complete orientation of c substrate, the diffraction spectrum then contains only reflexes of the (0 0 1) index. FIG. 1 shows the diffraction spectrum of a YBaCO layer produced according to the process described above, and confirms the outstandingly good orientation of the crystallites.

Silver recrystallizes in the region of 600°–900° C. according to the degree of previous cold deformation; this can be disadvantageous for the subsequently applied superconductor layer because of the resulting irregularities and unfavorable crystal orientation. This undesired effect is to a large extent suppressed when a silver-rich alloy of higher melting point than silver is used instead of pure silver. It was found that alloys with palladium are advantageous. Particularly in the range 95 mol % Ag / 5 mol % Pd through 80 mol % Ag / 20 mol % Pd, on the one hand no extensive reaction with the superconducting substance is observed, and on the other hand the recrystallization of the alloy is much less marked than with pure silver. Alloys with gold and platinum are likewise suitable, though considerably more expensive.

In practice it is desirable on cost grounds to partially substitute less expensive materials for the silver substrate material. Possibilities are metals and alloys which have a melting point higher than 960° C. and do not form lower-melting alloys, eutectics or compounds with silver. Apart from this, suitable metals must be sufficiently oxidation-resistant and free from scaling in the sintering atmosphere. Examples of suitable metals are Ni and high temperature resistant Ni/Cr alloys. For use as a substrate, these metals must be plated, e.g. electrochemically, with a layer (5–50 μm) of silver or silver-rich alloy. It is advantageous to apply an interlayer (0.1–2 μm) of palladium between the silver and the base metals; this improves adhesion and reduces oxidation. Substrates of silver or silver-rich alloy can also be applied to suitable supports of non-metals instead of metals, in order to produce mechanically stable structures with as small as possible a use of silver. For example, silver foils 50 μm thick can be attached in a heat-resistant manner to plates 0.6 mm thick of $Al_2O_3$ ceramic by combining with a thin interlayer of glass. For this purpose, the ceramic surface is thinly (10 μm) coated with a fine powder of a high-melting glass, e.g. Pyrex (Corning, USA), the silver foil is laid on it, and the assembly is heated for a few minutes to 900° C. Composite materials produced in this manner are equally as suitable as substrate/support as are the pure silver foils.

In place of $YBa_2Cu_3O_{6.5+y}$, other superconductors with the same stucture but with substituted components can be used. Numerous possible variants with critical temperatures $T_s \approx 90$ K are described in the literature. Firstly, for Y in $YBa_2Cu_3O_{6.5+y}$ there can be wholly or partially substituted La, Nd, Eu, Gd, Tb, Dy, Ho, Er, Tm and Lu. Further, for Cu there can be partially substituted Fe (0.5%), Ga (0.1%) and Al (<3%). Numerous further substitutions are also possible and can be included within the scope of the invention for the production of superconducting layers with crystal orientation.

EMBODIMENT EXAMPLE 1

Three different metal oxide compounds (mixed oxides) were first prepared in powder form.
(a) $YBa_2Cu_3O_{\approx 7}$
(b) $Y_2CuO_5$
(c) $BaCuO_2$.

Respective stoichiometric amounts of yttrium oxalate, barium oxalate and copper oxalate (usual commercial, purity 99.99%) were weighed out and added to a sealable polyethylene bottle. To these were added 4 parts by weight of water (double distilled) and 4% by weight, based on the solids, of the surfactant Dolapix PC21 (Zschimmer and Schwarz, West Germany) and also enough $NH_4OH$ solution to adjust the pH of the suspension to 6.9–7. The suspension was then placed in a comminuting apparatus ("Microfluidizer M-110", Microfluidics Corporation, 90 Oak Street, Newton, Mass. 02164, USA) operating on the underwater principle and releasing high impact energy. The suspension was then sprayed to a dry powder using a spray drier (Büchi, Switzerland, Mini Spray Drier 190). This powder was placed in a tube furnace in which an atmosphere of 90% by volume $N_2$ and 10% by volume $O_2$ was maintained. The powder was heated at a rate of 50° C./h to 800° C. and reacted at this temperature for 25 h, then cooled at 50° C./h in a pure oxygen atmosphere ($O_2$=1 bar). After cooling, the product was immediately transferred into an inert atmosphere free from water and $CO_2$ (usual commercial glove box). All of the following processes were carried out in it. Testing by X-ray diffraction showed that the desired substances were present in practically pure phase.

500 g of $YBa_2Cu_3O_{\simeq 7}$, were placed in a sealable polyethylene bottle, and 2,000 ml of water-free isopropanol ($H_2O$<0.01% by weight) and 10 g of hydroxypropylcellulose (molecular weight 300,000) were added. The suspension was then further treated in the abovementioned comminution apparatus ("Microfluidizer M-110") and after that was allowed to stand for 24 h for particle classification. The upper half of the volume was decanted. This part of the suspension contained 99% by weight of particles in the size range 0.8–0.1 μm.

In an analogous manner, powder and suspensions of the other two compounds (b) and (c) were prepared. The solids content of the suspensions was determined gravimetrically on a respective aliquot, by evaporating off the liquid, as moles of mixed oxide per gram of suspension. The following coating suspensions, corresponding to the first and second powder layers, were prepared by mixing the suspensions prepared by the above process. The respective molar solids content, on which the proportions of amounts were based, were hence:

1. Suspension for precoating with the composition 0.1 mol of $Y_2CuO_5$+0.4 mol $BaCuO_2$ (powder layer 1),
2. Suspension for after-coating with the composition 0.3 mol $YBa_2Cu_3O_{\simeq 7}$+0.01 mol $Y_2CuO_5$+0.04 mol $BaCuO_2$ (powder layer 2).

As the substrate 3, 50 μm thick bands of an alloy of 90 mol % silver and 10 mol % palladium were cut into strips 10 mm wide and 200 mm long. These bands had been etch-polished on one side using a polishing disk covered with nylon cloth. The etchant was a solution containing 100 ml of saturated aqueous $CrO_3$ solution and 45 ml of HCl (10%) added to 800 ml of water. About 4 μm of metal were removed in 2 min. The bands were then rinsed in twice-distilled water, dried, and adhered by one surface to a 100 μm thick Mylar foil.

For the first coating (powder layer 1), the bands were dipped vertically in the precoating suspension, which had previously been adjusted by addition of water-free isopropanol to a concentration of 10 g of solids per 100 ml. Using an apparatus which stood in an inert atmosphere free from water and $CO_2$, the bands were pulled out vertically upwards at a speed of 10 cm/min and the adherent layer was dried at 80° C. The coating amounted to about 2 mg/cm². Coating with the after-coating suspension subsequently followed (powder layer 2) in a similar manner, and this coating was repeated until the coating amounted to 6 mg/cm².

The coated bands 3 were now pulled off the Mylar foil, positioned on $Al_2O_3$ ceramic supports with the powder layer upwards, and transferred from the glove box into a tube furnace through which $O_2$ was passed at 1 bar. The layers are to be exposed to the atmosphere of the room only for a very short time during this transfer. The furnace temperature was increased to 400° C. at a rate of 50° C./h, then at 300° C./h to 923° C. and kept there for 30 minutes. The temperature was then reduced at a rate of 100° C./h to 500° C., held there for 2 h, and further cooled down to room temperature at 100° C./h.

The finished layers were well oriented, about 10 μm thick, and had a $T_c$=92 K and a critical current density $j_c$=1,800 A/cm² (77 K, H=0).

EMBODIMENT EXAMPLE 2

Corresponding powders of mixed oxides were produced according to Example 1. Suspensions of the respectively equal molar concentrations were made ready for the preparation of the powder layers 1 and 2. Coating took place in the present case by electrophoresis instead of by dipping.

A Pd layer 4 of 300 nm thickness was first deposited electrochemically on a support 6 of a nickel-base superalloy with the trade name IN 625 (Inco) in the form of a sheet 2 mm thick after corresponding cleaning. The superalloy had the following composition:

Cr=21.5% by weight
Mo=9.0% by weight
Nb=3.6% by weight
Al=0.2% by weight
Ti=0.2% by weight
Fe=2.5% by weight
Mn=0.2% by weight
Si=0.2% by weight
C=0.05% by weight An Ag layer 5 μm thick was now applied electrochemically as the substrate proper to the Pd layer 4. The edge of the Ag layer 3 and also the narrow sides and the back side of the support 6 were covered with adhesive tape and the whole was placed vertically in an electro-phoresis bath. Suspensions were used, as starting materials for the electrophoresis, which had been diluted with water-free isopropanol such that their solids content amounted to 2 g/100 g of suspension. A silver sheet was set up as counter-electrode at a spacing of 3 cm and parallel to this body, on the side facing the Ag layer 3. An electrical potential difference was applied to these electrodes such that the substrate 3 acted as the anode (+) and the silver sheet as the cathode (−). The voltage was adjusted so that a current flowed with a current density of 100 μA/cm². After the first powder layer 1 composed of oxide mixtures and mixed oxide had reached a thickness of 3 μm, its density being about 50% of the theoretical value, the coated body was taken out of the bath and dried in an inert atmosphere at 80° C. The second powder layer 2 of $YBa_2Cu_3O_{\simeq 7}$ was then applied in a similar manner in a thickness of 5 μm and dried, and this step of the process was repeated twice more. The electrophoretic coating must be carried out, like the other processes, in an inert atmosphere free from water and $CO_2$.

After completed coating and drying, the body was heat treated for sintering of the surface layer 8, analogously to Example 1. The sintered layers produced according to the present example were likewise well oriented. They had a $T_c$=91 K and a critical current density $j_c$=2,100 A/cm² (77 K, H=0).

EMBODIMENT EXAMPLE 3

Proceeding firstly exactly as in Example 1, a suspension for precoating and one for after-coating were respectively prepared. A flat bar of quartz $SiO_2$, 20 mm wide and 4 mm thick, was used as the support 6. A 100 nm thick Cr layer 5 was first applied around this bar as an adhesion promoter by means of cathode sputtering. The bar was then electrochemically provided with a Pd layer 4 of 500 nm thickness, on which in turn a Pd/Ag layer (5 % by weight Pd, 95% by weight Ag) of 10 μm thickness was electrochemically deposited as the substrate proper 3. After washing and drying the coated support 6, a sequence of layers was applied electrophoretically to this substrate 3, in an analogous manner to Example 2, and was sintered to a polycrystalline, crystal-oriented surface layer of superconducting substance $YBa_2Cu_3O_{\approx 7}$. At a critical temperature $T_c = 90.5$ K, a critical current density $j_c = 2,200$ A/cm$^2$ (77 K, H=0) was attained.

The invention is not limited to the Embodiment Examples. The process for the production of a polycrystalline, crystal-oriented surface layer 8 on a substrate 3 or an interlayer between two substrates 3, where said layer consists of a ceramic high temperature superconductor based on $(Y,RE)Ba_2Cu_3O_{6.5+y}$, where RE=rare earth metal and $0y<1$, is carried out in that pure metallic silver or a silver alloy containing up to 20% by weight of Au or Pd or Pt is used as the substrate 3 and a first powder layer 1 of a thickness of at most 5 μm with particles of at most <2 μm diameter consisting of the simple oxides and/or mixed oxides of the elements Y, Ba, Cu or the oxides of the elements Y and Cu and the carbonate of Ba, corresponding to the stoichiometric ratio Y:Ba:Cu:O = 1:2:3:6.5, is applied to said substrate 3, and on it is applied a second powder layer 2, consisting of 1–10 mol % of the abovementioned powder mixture and the remainder powder of the superconducting substance $(Y,RE) Ba_2Cu_3O_{6.5+y}$, with a thickness of 5–10 μm, and the whole is sintered in an atmosphere of at least 20% by volume $O_2$, remainder $N_2$ or an inert gas, under a total gas pressure of at least 1 bar at a sintering temperature of at least 885° C. and at most 927° C., wherein the whole is first heated at a rate of at most 50° C./h to 400° C., then at a rate of at most 300° C./h to the sintering temperature, and held at this temperature for 30 minutes, whereupon a liquid phase of 0.1–5% by volume is transitorily formed in the layer, and the whole is cooled at a rate of at most 100° C./h to 600–400° C., held at this temperature for 2 hours, and finally cooled at a rate of at most 100° C./h to room temperature.

The sintering is preferably carried out under a pressure of 1 bar in a pure $O_2$ atmosphere in the temperature range of 915°–927° C. or under a pressure of 1 bar in air in the temperature range of 885°–900° C. In the general case, the substrate 3 of silver or of a silver alloy is applied before the production of the surface layer 8 to a shape-determining and/or mechanically non-positive support 6 of a base material other than silver or a silver alloy, the base material preferably consisting of a heat-resistant alloy such as a nickel-base superalloy, or a ceramic material such as $SiO_2$, MgO, $ZrO_2$, or of an oxide, carbide or nitride, or of a semiconductor such as Si or Ge. An interlayer 5 of Cr, a Cr/Ni alloy as adhesion promoter, and/or a further layer 4 of Pd is first advantageously applied to the base material. According to a special kind of embodiment, two powder-coated substrates 3 are superposed with the coated sides together, pressed, and subsequently sintered.

The preparation of the powder of $YBa_2Cu_3O_{6.5+y}$ and of the mixed oxides of the first powder layer 1 advantageously takes place by mixing the stoichiometric amounts of the corresponding metal oxalates or carbonates, forming an aqueous suspension of these materials, comminution of the suspended particles, subsequent drying of the suspension in a spray drier, and reacting the pulverulent mixture of materials to form powders of the respective oxide compounds at 700° C.–800° C. in an atmosphere of $N_2 + 10\%$ by volume $O_2$, whereupon coating is then carried out from a colloidal suspension of the powder in a water-free liquid, preferably by pulling the substrate 3 out of the water-free suspension at a controlled speed and by controlled drying in an atmosphere free from water and $CO_2$. According to a variant, the coating of the substrate 3 takes place by electrophoretic deposition of the powder particles from a suspension in water-free liquid and subsequent controlled drying in an atmosphere free from water and $CO_2$.

According to a modified process, Cu is partially substituted by at least one of the elements Fe, Ga, Al in a total content of at most 2 mol %. Apart from this, the Ba is partially substituted, in a further modified embodiment, by La in a content of at most 20 mol %.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A process for the production of a polycrystalline crystal-oriented layer of a ceramic high temperature superconductor, having the nominal composition $YBa_2Cu_3O_{6.5+y}$ where $0<y<1$, wherein said superconductor is applied to a substrate in the form of a powder layer and is then sintered at a sintering temperature, said process further comprising the steps of:

providing said substrate consisting of pure metallic silver or a silver alloy containing up to 20% by weight of Au, Pd or Pt;

applying onto said substrate a first layer of a first powder having a particle diameter or less than 2 microns, said first powder consisting of simple oxides and/or mixed oxides of the elements Y, Ba, Cu or the oxides of the elements Y and Cu and the carbonate of Ba, corresponding to the stoichiometric ratio Y:Ba:Cu:O = 1:2:3:6.5, said first layer having a thickness of at most 5 microns, which first powder creates a melt at said sintering temperature and transforms into said superconductor during said sintering step;

applying onto said first layer a second layer having a thickness of 5–10 microns of a second powder, said second powder containing 1–10 mol % of said first powder, the remainder being said superconducting powder; and sintering said substrate with said first and second layers in an atmosphere containing at least 20% by volume $O_2$, the remainder being $N_2$ or an inert gas, under a total gas pressure of at least 1 bar and a sintering temperature of at least 885° C. and at most 927° C., wherein said sintering step comprises first heating at a rate of at most 50° C./h to 400° C.;

heating at a rate of at most 300° C./h to said sintering temperature;

holding at said sintering temperature for 30 minutes, whereupon a liquid phase of 0.1-5% by volume is transitorily formed in said first layer;

cooling at a rate of at most 100° C./h to 600°-400° C., and holding at this temperature for 2 hours; and cooling at a rate of at most 100° C./h to room temperature.

2. The process as claimed in claim 1, wherein said sintering is carried out under a pressure of 1 bar in a pure $O_2$ atmosphere in the temperature range of 915°-927° C.

3. The process as claimed in claim 1, wherein said sintering is carried out under a pressure of 1 bar in air in the temperature range of 885°-900° C.

4. The process as claimed in claim 1, wherein the preparation of said superconducting powder and said first powder comprises the steps of:

mixing stoichiometric amounts of the corresponding metal oxalates or carbonates;

forming an aqueous suspension of said metal oxalates or carbonates;

comminuting the particles of said aqueous suspension;

subsequently drying said aqueous suspension in a spray drier; and reacting the pulverulent mixture of said spray-dried materials to form powders of the respective oxide compounds at 700° C.-800° C. in an atmosphere of $N_2 + 10\%$ by volume $O_2$.

5. The process as claimed in claim 1, wherein said application of said first and second layers takes place from a collodial suspension of said first and second powders in a water-free liquid.

6. The process as claimed in claim 1, wherein said application of said first and second layers takes place by pulling said substrate out of a water-free suspension of said first and second powders at a controlled speed and by controlled drying in an atmosphere free from water and $CO_2$.

7. The process as claimed in claim 1, wherein said application of said first and second layers takes place by electrophoretic deposition of said first and second powders from a suspension in a water-free liquid and subsequent controlled drying in an atmosphere free from water and $CO_2$.

8. The process as claimed in claim 1, wherein within said superconductor powder and said first and second powders Cu is partially substituted by at least one of the elements Fe, Ga, Al in a total content of at most 2 mol %.

9. The process as claimed in claim 1, wherein within said superconductor powder and said first and second powders Ba is partially substituted by La in a content of at most 20 mol %.

10. The process as claimed in claim 1, wherein said substrate of silver or of a silver alloy is applied before said production of said polycrystalline crystal-oriented layer to a support material selected from the group consisting of nickel-based superalloys, ceramic materials, oxides, carbides, nitrides, and semiconductors.

11. The process as claimed in claim 10, wherein said ceramic materials are $SiO_2$, MgO, or $ZrO_2$.

12. The process as claimed in claim 10, wherein said semiconductors are Si or Ga.

13. The process as claimed in claim 10, wherein an interlayer of Cr, a Cr/Ni alloy as an adhesion promoter, and/or a further layer of Pd is first applied to said support material.

* * * * *